United States Patent [19]

Kuhl et al.

[11] Patent Number: 4,752,244
[45] Date of Patent: Jun. 21, 1988

[54] ZERO INSERTION FORCE EDGE CLIP INTERCONNECT PIN

[75] Inventors: Virgil F. Kuhl, Lauderhill; Lamar Q. Williams, Plantation; Kenneth M. Wasko; William B. Mullen, III, both of Boca Raton, all of Fla.

[73] Assignee: Motorola, Inc., Schaumburg, Ill.

[21] Appl. No.: 66,280

[22] Filed: Jun. 25, 1987

[51] Int. Cl.$^4$ .............................................. H01R 13/11
[52] U.S. Cl. ..................................... 439/635; 439/858; 439/861
[58] Field of Search ............... 439/260, 262, 263, 265, 439/629, 630, 631, 633, 634, 635, 636, 835, 842, 858, 861

[56] References Cited

U.S. PATENT DOCUMENTS

| | | | |
|---|---|---|---|
| 2,917,612 | 12/1959 | Chabot | 439/861 |
| 4,367,006 | 1/1983 | Rehbogen, Jr. et al. | 439/858 |
| 4,567,543 | 1/1986 | Miniet | 361/398 |
| 4,598,972 | 7/1986 | Mullen, III et al. | 339/258 R |
| 4,618,209 | 10/1986 | Sonobe | 439/861 |

Primary Examiner—Joseph H. McGlynn
Attorney, Agent, or Firm—Martin J. McKinley

[57] ABSTRACT

An electrical interconnect pin, particularly suitable for attachment to the edge of a flexible printed circuit board or "flex circuit", has an edge clip with an opening that can be temporarily enlarged to facilitate the attachment of the pin to the edge of a circuit board. The pin includes an elongated shank with a rectangular cross section and two substantially identical clips attached to opposite sides of the shank. To attach the pin to a printed circuit board, the pin is placed on a flat surface with the shank parallel to the surface. A force is then applied to the shank just below the clips and perpendicular to the surface. This force opens up the edge clip and the edge of the printed circuit board is then inserted into the opening of the edge clip. After the force is removed, the edge clip clamps down on the circuit board, temporarily attaching the pin to the board. The pins can then be permanently affixed to the board by soldering.

3 Claims, 2 Drawing Sheets

ZERO INSERTION FORCE EDGE CLIP INTERCONNECT PIN

BACKGROUND OF THE INVENTION

This invention relates to electrical interconnect pins of the type that include an edge clip at one end of the pin for attaching the pin to the edge of a printed circuit substrate. More particularly, this invention relates to an interconnect pin that has a zero insertion force edge clip that is suitable for attaching the pin to the edge of a flexible printed circuit substrate or "flex circuit".

An electronic module can be constructed by attaching electrical components to a flex circuit. The flex circuit usually consists of a thin sheet of polyimide film onto which metallic conductors are bonded. The components, which are typically leadless, are then soldered to the metallic conductors at appropriate locations. The flex circuit is typically folded in accordian fashion and then inserted into a housing. To interconnect this flex circuit module to a main circuit board, pins may be attached to the edge of the flex circuit. These pins can then be removably inserted into mating sockets which are attached to the main circuit board.

Figure 1:
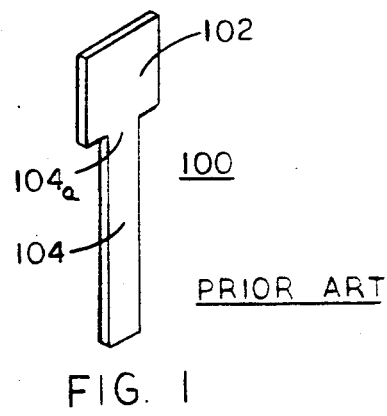
FIGS. 1-3 show prior art pins.

Referring to FIG. 1, a typical interconnect pin 100 is usually flat and may include an enlarged area 102 known as a "paddle" at the soldering end 104a of the shank 104. The purpose of paddle 102 is to increase the bond area, and hence the bond strength between pin 100 and the flex circuit to which the pin is soldered.

Although flat pins have been attached to flex circuits with some success, they are not without their drawbacks. First, the "peel" strength of a flat pin is low; that is, when forces are applied to the pin and the edge of the flex circuit in opposite directions perpendicular to the surface of the flex circuit, the flat pin is easily separated or "peeled away" from the flex circuit. To compensate for low peel strength, a small reinforcing strip of polyimide is usually adhesively bonded to the edge of the flex circuit over the pins. This technique is illustrated in U.S. Pat. No. 4,567,543 to Miniet. Although this increases peel strength, it does so at the expense of adding another manufacturing step. Furthermore, since flat pins are applied to the flex circuit before the electronic components are attached, the heat generated during component soldering frequently delaminates this reinforcing strip. Flat pins also require a fixture to hold them precisely in place during the soldering process, i.e., they cannot be mechanically attached and then soldered in place at a later time.

Figure 2:
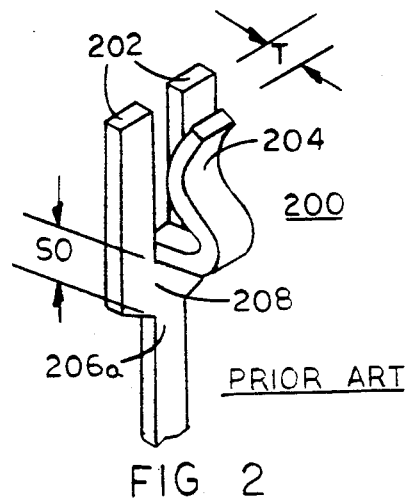
Figure 3:
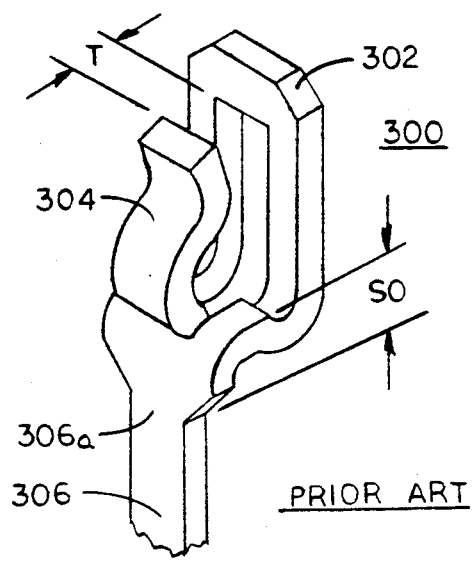

Referring to FIGS. 2 and 3, typical "edge clip" pins 200 and 300 have several advantages over flat pins. First, edge clip pins have very high peel strength because they are usually soldered to both sides of the printed circuit substrate. Second, a substrate clamping force is created between rear bracing members 202 or 302, and front spring fingers 204 or 304 that temporarily holds the pin in place until it is permanently soldered to the substrate.

Edge clip pins are attached to a substrate by forcing the edge clip over the edge of the substrate, thereby flexing spring finger 204 or 304 and generating the clamping force. Edge clip pins can easily be attached to rigid substrates such as printed circuit boards and ceramic substrates, however, attachment to flexible circuit substrates is difficult, especially during automated assembly, because the edge of the flex circuit usually bends or breaks when attempting to force the edge clip over the edge of the flexible substrate.

An edge clip pin also has an undesirable "stand-off" distance. Stand-off, which is illustrated in FIGS. 2 and 3 as distance "SO", is the distance between the bottom edge of the substrate (when fully inserted into the edge clip) and clip end 206a or 306a of shank 206 or 306.

Stand-off distance SO is particularly important in small electronic apparatus, such as selective call paging receivers ("pagers") and hand-held twoway portable radios, where one or more modules typically plug into sockets on a main circuit board (the module substrates being perpendicular to the main circuit board). In this particular application, stand-off usually results in an increase in the overall dimensions of the product, e.g., the depth of the outer housing of the product.

Since an edge clip pin "wraps around" both sides and one edge of the substrate, its theoretical minimum distance should be equal to the thickness of spring finger 204 or 304, i.e., the thickness of the stock material from which the pin is die stamped. An examination of FIGS. 2 and 3 reveals that neither of these two pins achieve minimum stand-off distance.

The throat opening of an edge clip is illustrated in FIGS. 2 and 3 as distance "T". The throat opening can usually be adjusted to some extent to accommodate various substrate thicknesses by inserting a spreader wheel, prior to attaching the edge clip to the substrate, between rear bracing member 202 or 302 and spring finger 204 or 304. A typical prior art edge clip pin having a nominal throat opening of 10 mils can usually be spread to cover a range from 6 to 14 mils, or a total variation of 8 mils. It would be desirable if this range of throat openings could be increased.

SUMMARY OF THE INVENTION

An object of the invention is to provide an edge clip interconnect pin that includes one or more of the following: an edge clip that generates a clamping force on the substrate, but has zero insertion force during attachment to the substrate; a stand-off distance approximately equal to the thickness of the pin; a throat opening that can be adjusted to accommodate a wide range of substrate thicknesses; and a throat opening that can be widened during attachment to reduce machine tolerances for automated attachment of the pin to the substrate.

Briefly, the invention is a zero insertion force edge clip interconnect pin that includes an elongated shank that has first, second, third and fourth respectively perpendicular sides (e.g., an elongated parallelepiped). The two ends of the shank are referred to as the clip and pin ends. A first elongated clip has first, second and third respectively contiguous sections. The two ends of the clip are referred to as the attachment and free ends. The attachment end of the first clip attaches to the first side of the shank. The first section of the first clip extends from the attachment end of the clip towards the pin end of the shank. This first section is angled towards the fourth side of the shank at a first acute angle from the second side of the shank. The second section of the first clip curves at predetermined points in a first direction of curvature (e.g., counterclockwise). This second section curves towards the second side of the shank, extends beyond the second side, and then curves back towards the second side. The third section of the first clip curves in a second direction of curvature opposite the first direction (e.g., clockwise). This third section approaches the second side of the shank, is nearest the second side at a proximal point, and diverges away from the second side of the shank from its proximal point to the free end of the first clip.

In addition to the aforementioned elements, another embodiment of the invention further includes a second clip, substantially identical to the first clip, but attached to the third side of the shank opposite the first clip. The second clip is positioned at a second acute angle from the second side of the shank that is less than the first acute angle of the first clip; thereby positioning the proximal point of the first clip nearer the second side of the shank than the proximal point of the second clip.

In another embodiment, the invention is a method of attaching a zero insertion force edge clip interconnect pin to a printed circuit substrate. The steps include placing the interconnect pin on a supporting surface wherein the shank of the pin lies substantially parallel to the supporting surface. Next, a force is applied to the shank perpendicular to the supporting surface, thereby enlarging the throat opening of the edge clip. Finally, the printed circuit substrate is inserted into the enlarged opening of the edge clip.

DESCRIPTION OF THE PREFERRED EMBODIMENT

Figure 4:
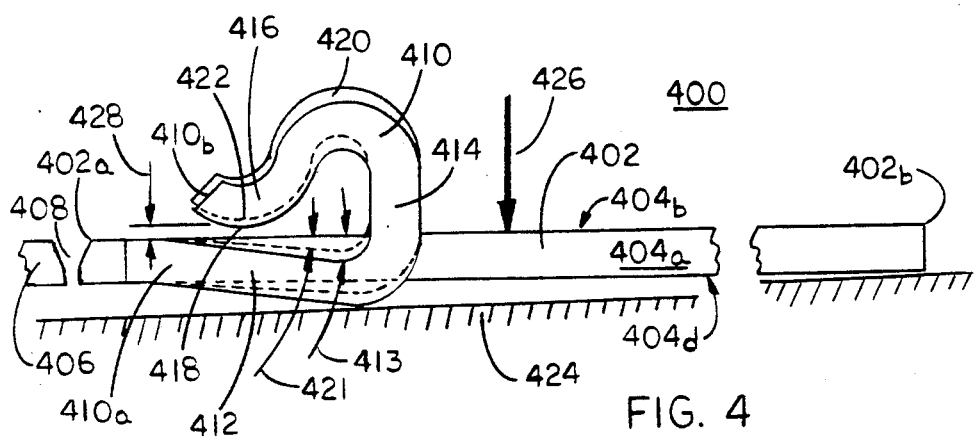
FIGS. 4 & 5 show a side and plan view of the invention.

Referring to FIG. 4, a zero insertion force edge clip interconnect pin 400 includes an elongated shank 402 that has a clip end 402a and a pin end 402b. Shank 402 is preferably rectangular in crosssection, and thereby includes four respectively perpendicular sides of which side 404a and the edges of sides 404b and 404d are visible in FIG. 4 (the edge of side 404c is visible in FIG. 5). Shank 402 is initially attached to a carrier 406 at clip end 402a and a "V" shaped groove 408 permits the shank to be easily separated from carrier 406. In FIG. 4, pin 400 is shown detached from carrier 406. Carrier 406 is described below in greater detail and illustrated more completely in FIG. 5. "V" shaped groove 408 is preferably formed at a 50 degree angle and extends two-thirds of the way from side 404b to side 404d.

A first clip 410 is attached to side 404a of shank 402 at the attachment end 410a of the first clip. The other end of first clip 410 is unattached and is referred to as free end 410b. For the purposes of this discussion, it is convenient to visualize clip 410 as comprising three contiguous segments 412, 414 and 416.

First section 412 extends from attachment end 410a toward the pin end 402b of shank 402 and is angled towards the fourth side 404d of the shank at an acute angle 413, preferably 7 degrees, from the second side 404b of the shank. Second section 414 curves in a counter-clockwise direction upward toward the second side 404b of the shank, extends beyond second side 404b, and then curves in the same direction back down towards second side 404b. Third section 416 curves in the opposite, or clockwise direction. Third section 416 approaches the second side 404b of the shank, is nearest second side 404b at proximal point 418, and then diverges away from the second side 404b from proximal point 418 to free end 410b.

A second clip 420 is substantially identical in shape to first clip 410; however, second clip 420, is attached to the third side 404c of shank 402 (third side 404c is not visible in FIG. 4, but is the side opposite side 404a) and the angle 421 between the first section of second clip 420 and side 404b is less than angle 413 of first clip 410. Consequently, the proximal point 422 of second clip 420 is farther from side 404b than proximal point 418 of first clip 410.

Edge clip interconnect pin 400 is preferably manufactured by die stamping a 0.014 inch thick by 0.693 inch wide strip of half-hard CDA 770 copper alloy, and then forming the parts as described above as is well known in the industry. The entire part preferably has a 0.0001 to 0.0002 inch thick bright copper plating followed by a ductile sulfamate nickel plating of the same thickness. From clip 410 to pin end 402b, shank 402 is preferably gold plated to a thickness of 0.00003 to 0.00006 inches. Clips 410 and 420, and that section of shank 402 that lies adjacent the clips is preferably plated with a bright acid tin to a thickness of 0.0001 to 0.0003 inches. No additional plating is applied to the carriers 406 and 502.

Figure 5:
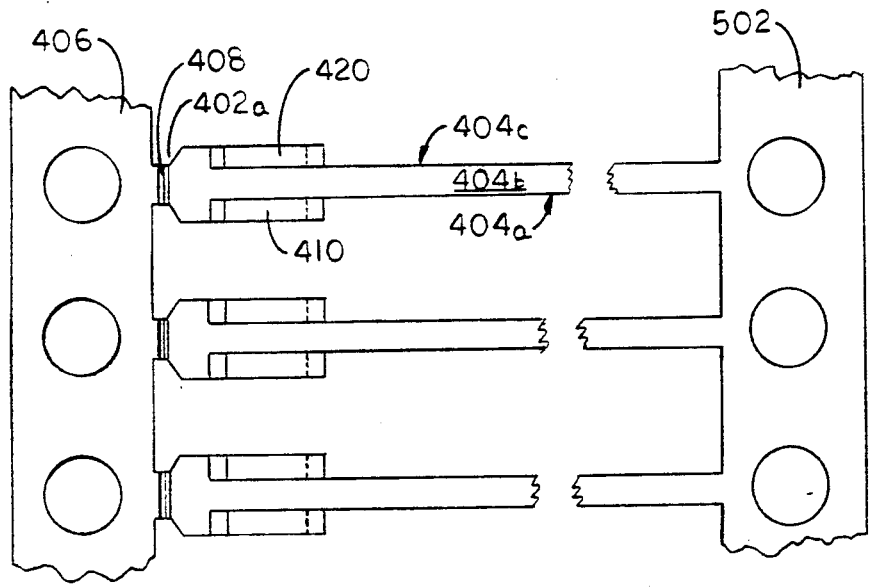

In FIG. 5, a plurality of edge clip interconnect pins 400 are illustrated attached to carriers 406 and 502. Although only three pins 400 are illustrated, thousands of pins are typically attached to the carriers, which can then be easily rolled onto a reel. Carrier 406 is separated from pin 400 at "V" shaped groove 408. After the pins 400 have been attached to the edge of a printed circuit substrate, shanks 402 can be sheared to any desired length, thereby separating the shanks from carrier 502.

Returning to FIG. 4, to attach a printed circuit substrate (not illustrated) to edge clip pin 400, the pin is first placed on a substantially flat surface 424 with shank 402 running substantially parallel to the surface, such that section 412 and the pin end 402b of the shank touch the surface. A force 426 is then applied to shank 402 near edge clips 410 and 420, forcing proximal point 418 of first clip 410 to move away from side 404b of pin shank 402. With sufficient force and proper initial spreading of the opening opening 428, proximal point 418 moves sufficiently above side 404b such that the substrate encounters no resistance when initially being inserted into edge clips 410 and 420. Upon removal of force 424, edge clips 410 and 420 clamp down on the substrate, thereby holding pin 400 in place.

It is important that the angles 413 and 421 of first clip 410 and second clip 420 be different. When force 424 is applied to shank 402, first clip 410 begins to deflect upwards towards surface 404b, thereby enlarging the opening 428; but, second clip 420 initially remains stationary. If both clips 410 and 420 were set at the same angle, force 426 would attempt to bend both clips 410 and 420 at the their attachment ends, but the additional resistance of the second clip would cause the force to bend shank 402 instead. Although some expansion of opening 428 will occur if angles 413 and 421 are identical, a larger expansion occurs if these two angles are different.

Prior to attaching the pin to a printed circuit substrate, it is usually desirable to adjust the opening 428 to a distance slightly smaller, typically 2 mils less, than the thickness of the printed circuit substrate. Because the edge clips 410 and 420 begin at the substrate end 402a of shank 402, they are inherently longer than prior art spring fingers 204 or 304 and, therefore, can be adjusted over a wider range by the spreader wheel. The edge clip interconnect pin 400, having a nominal opening of 10 mils, can be varied over a range of 12 mils, which is a significant improvement over the prior art range of 8.

Edge clip pin 400 is ideally suited for attachment to a flex circuit because opening 428 can be enlarged to a distance slightly greater than the thickness of the flex circuit. Therefore, no force is required to insert the edge of the flex circuit into the edge clip and, consequently, no damage to the flex circuit edge can occur. Upon releasing force 424, clips 410 and 420 generate a clamping force on the flex circuit which temporarily holds the pins in place, thereby eliminating the requirement of a fixture to hold the pins in place during soldering.

We claim as our invention:

1. A zero insertion force edge clip interconnect pin, comprising in combination:
    an elongated shank with clip and pin ends and having first, second, third and fourth respectively perpendicular sides;
    a first elongated clip with attachment and free ends and having first, second and third respectively contiguous sections, said first clip being attached to said first side of the shank at its attachment end;
    said first section of the first clip extending from its attachment end towards said pin end of the shank and angled towards said fourth side of the shank at a first acute angle from said second side of the shank;
    said second section of the first clip curving at predetermined points in a first direction of curvature, wherein this second section curves towards said second side of the shank, extends beyond said second side, and then curves back towards said second side; and
    said third section of the first clip curving in a second direction of curvature opposite said first direction, wherein this third section approaches said second side of the shank, is nearest said second side at a proximal point, and diverges away from said second side from its proximal point to said free end of the first clip.

2. The interconnect pin of claim 1, further comprising:
    a second elongated clip with attachment and free ends and having first, second and third respectively contiguous sections, said second clip being attached to said third side of the shank at its attachment end;
    said first section of the second clip extending from its attachment end towards said pin end of the shank and angled towards said fourth side of the shank at a second acute angle from said second side of the shank, said second acute angle of the second clip being less than said first acute angle of the first clip;
    said second section of the second clip curving at predetermined points in said first direction of curvature, wherein this second section curves towards said second side of the shank, extends beyond said second side, and then curves back towards said second side;
    said third section of the second clip curving in said second direction of curvature, wherein this third section approaches said second side of the shank, is nearest said second side at a proximal point, and diverges away from said second side from its proximal point to said free end of the second clip; and
    said proximal point of the first clip is positioned nearer said second side of the shank than said proximal point of the second clip.

3. A method of attaching a zero insertion force edge clip interconnect pin to a printed circuit substrate, comprising the steps of:
    placing said interconnect pin on a supporting surface, wherein the shank of said interconnect pin lies substantially parallel to said supporting surface; and
    applying a force to the shank of said interconnect pin perpendicular to said supporting surface, thereby enlarging the throat opening of the edge clip of said interconnect pin; and
    inserting said printed circuit substrate into said opening of said edge clip.

* * * * *